(12) United States Patent
Yoon et al.

(10) Patent No.: US 7,390,973 B2
(45) Date of Patent: Jun. 24, 2008

(54) MEMORY MODULE AND SIGNAL LINE ARRANGEMENT METHOD THEREOF

(75) Inventors: Chil-Nam Yoon, Suwon-si (KR); Kwang-Seop Kim, Yongin-si (KR); Do-Hyung Kim, Yongin-si (KR); Jae-Jun Lee, Seongnam-si (KR); Ki-Hyun Ko, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 145 days.

(21) Appl. No.: 11/357,500

(22) Filed: Feb. 17, 2006

(65) Prior Publication Data

US 2006/0207788 A1     Sep. 21, 2006

(30) Foreign Application Priority Data

Mar. 15, 2005   (KR)   ................ 10-2005-0021552

(51) Int. Cl.
*H05K 1/16*   (2006.01)

(52) U.S. Cl. .................. 174/260; 174/250; 174/255; 174/261; 174/262; 361/730; 361/748; 361/760; 361/764; 29/831; 29/846; 257/685; 257/689

(58) Field of Classification Search ................ 174/260, 174/250, 255, 261, 262; 257/685, 686, 723, 257/736, 777, 778, 689; 361/730, 748, 760, 361/764; 29/831, 846
See application file for complete search history.

(56) References Cited

U.S. PATENT DOCUMENTS 3,370,203 A * 2/1968 Kravitz et al. ............... 361/730
5,777,391 A * 7/1998 Nakamura et al. .......... 257/778
5,910,685 A * 6/1999 Watanabe et al. ........... 257/777
6,021,048 A * 2/2000 Smith .......................... 361/736
6,424,030 B2 * 7/2002 Masayuki et al. ........... 257/685
6,521,993 B2 * 2/2003 Masayuki et al. ........... 257/723
2002/0113307 A1   8/2002 Jamieson ..................... 257/698
2004/0099938 A1 * 5/2004 Kang et al. .................. 257/686
2006/0055017 A1 * 3/2006 Cho et al. .................... 257/686
2006/0157842 A1 * 7/2006 Goodwin ..................... 257/686
2006/0192277 A1 * 8/2006 RaghuRam ................. 257/686

FOREIGN PATENT DOCUMENTS

| JP | 2003-249760 | 9/2003 |
| JP | 2004-128315 | 4/2004 |
| TW | 504899 | 10/2002 |
| TW | 200418044 | 9/2004 |

* cited by examiner

*Primary Examiner*—Diego Gutierrez
*Assistant Examiner*—Xiaoliang Chen
(74) *Attorney, Agent, or Firm*—Mills & Onello LLP (57) ABSTRACT

The pesent invention discloses a memory module and a signal line arrangement method thereof. The memory module includes memory chips mounted on both sidees in a mirror form; and a printed circuit board (PCB) having same signal applying contact pads arranged on both sodes which same signal applying balls of the memory chips contact in the mirror form, wherein a via is formed at a location close to the same signal applying contact pad of one side among the same signal applying contact pads arranged on both sides in the mirror form, the via connecting the other side to the signal line of one side, and a signal transmitted from the other side is connected to a contact junction, the contact junction is connected to the same signal applying contact pad of the other side, the contact junction is connected to the via of the other side, and the via of one side is connected to the same signal applying contact pad of one side.

10 Claims, 7 Drawing Sheets

MEMORY MODULE AND SIGNAL LINE ARRANGEMENT METHOD THEREOF

CROSS-REFERENCE TO RELATED APPLICATION

This application claims the benefit of Korean Patent Application No. 2005-21552, filed Mar. 15, 2005, the disclosure of which is hereby incorporated herein by reference in its entirety.

BACKGROUND OF THE INVENTION

1. Field of the Invention

The present invention relates to a memory module and, more particularly, to a memory module having memory chips on both sides thereof and a signal line arrangement method thereof.

2. Description of the Related Art

A memory module generally includes a printed circuit board (PCB) and memory chips. The memory chips mounted on the PCB can be arranged on both sides of the PCB in a mirrored configuration. That is, a same signal applying ball (pin) of each memory chip mounted on both sides of the PCB can be arranged on both sides of the PCB in a mirror form.

A conventional signal line arrangement method includes forming a via passing through a central location of pads in contact with the same signal applying balls (pins) of memory chips on both sides of the PCB in a mirrored configuration, and connecting a signal line to a same signal applying ball of one side from the via and connecting a signal line to the same signal applying ball of the other side from the via.

However, this method has a spatial limitation to arranging signal lines arranged around the via since the via has to be located at a center of the pads to which the same signal applying balls (pins) arranged on both sides of the PCB in a mirror form contact. Further, since a time for a signal to pass through the via is not considered, signal transmission times spent for a signal to be transmitted to the pads which the same signal applying balls (pins) arranged on both sides in a mirror form contact can differ, and thus if a signal which operates at a high frequency is transmitted, signal distortion can occur.

Another conventional signal line arrangement method of the memory module is to arrange the via at a location close to one of the pads which the same signal applying balls (pins) contact according to the arrangement of signal lines arranged around the via without forming the via on the central location of the pads which the same signal applying balls (pins) arranged in the mirror form contact. Here, signal lines arranged on both sides are same in length of from the via to the same signal applying balls (pins). That is, in order to make equal a length of the signal line from the via to the pad which is arranged on one side of the PCB and the same signal applying balls (pins) contact and a length of the signal line from the via to the pad which is arranged on the other side of the PCB and the same signal applying balls (pins) contact, one signal line is arranged in a straight line from, and the other signal line is arranged in a bent form.

Thus, this method has an advantage in that signals can be transmitted at the same time point since the signal lines are the same in length from the via to the same signal applying balls arranged on both sides of the PCB and is also efficient in arranging the signal lines around the via. However, a length of the signal line from via to the pad can become lengthy because the via is arranged at a location close to one of the pads which the same signal applying balls (pins) contact. Thus, this method has a limitation in that it is not conductive to transmit a high-frequency signal, like the first method for arranging the via at the central location of the same signal applying balls (pins) described above. Similar to the first method, since a time to pass through the via is not considered, signal distortion can occur when the high-frequency signal is transmitted, because signal transmission times for a signal to be transmitted to the pads in contact with the same signal applying balls (pins) arranged on both sides of the PCB in a mirrored configuration can differ.

SUMMARY OF THE INVENTION

It is an object of the present invention to provide a memory module which can efficiently transmit a high-frequency signal even though a via is arranged at a location that is in proximity to one of pads in contact with the same signal applying balls (pins) on both sides of the PCB.

It is another object of the present invention to provide a signal arrangement method of a memory module which can efficiently transmit a high-frequency signal even though a via is arranged at a location that is in proximity to one of pads in contact with the same signal applying balls (pins) on both sides of the PCB.

In one aspect, the present invention is directed to a memory module, comprising: memory chips mounted on both sides of the module in a mirrored configuration; and a printed circuit board (PCB) having same signal applying contact pads arranged on both sides in contact with same signal applying balls of the memory chips in the mirrored configuration, the PCB including a via at a location proximal to the same signal applying contact pad of one side of the PCB among the same signal applying contact pads arranged on both sides in the mirrored configuration, the via connecting an other side of the PCB to the one side of the PCB, and a contact junction connected to the same signal applying contact pad of the other side of the PCB, the contact junction being connected to the via of the other side of the PCB, and the via of the one side of the PCB being connected to the same signal applying contact pad of the one side of the PCB, the contact junction connected to a signal terminal from the other side of the PCB.

In one embodiment, the contact junction is positioned at a location such that a signal transmission time from the contact junction to the same signal applying contact pad of the one side of the PCB is equal to a signal transmission time from the contact junction to the same signal applying contact pad of the other side of the PCB.

In another embodiment, the contact junction is positioned between the via and the same signal applying contact pad of the other side.

In another embodiment, the PCB has at least 4 layers.

In another embodiment, a length of a signal path from the contact junction of the other side of the PCB to the same signal applying contact pad of the other side of the PCB is equal to a sum of a length of a signal path from the contact junction of the other side of the PCB to the via of the other side of the PCB, a length of the via from the other side of the PCB to the one side of the PCB, and a length of a signal path from the via of the one side of the PCB to the same signal applying contact pad of the one side of the PCB.

In another embodiment, signal lines transmitting high-frequency signals are arranged proximal to the via.

In another aspect, the present invention is directed to a signal line arrangement method of a memory module including memory chips mounted on both sides of the module in a mirrored configuration and a printed circuit board (PCB) having same signal applying contact pads arranged on both sides in contact with same signal applying balls of the memory chips in the mirrored configuration. The method comprises: forming a via at a location proximal to the same signal applying contact pad of one side of the PCB among the same signal applying contact pads arranged on both sides in the mirrored configuration, the via connecting an other side of the PCB to the one side of the PCB, and connecting a signal terminal from the other side of the PCB to a contact junction, connecting the contact junction to the same signal applying contact pad of the other side of the PCB, connecting the contact junction to the via of the other side of the PCB, and connecting the via of the one side of the PCB to the same signal applying contact pad of the one side of the PCB.

In one embodiment, the method further comprises positioning the contact junction at a location such that a signal transmission time from the contact junction to the same signal applying contact pad of the one side of the PCB is equal to a signal transmission time from the contact junction to the same signal applying contact pad of the other side of the PCB.

In another embodiment, the method further comprises positioning the contact between the via and the same signal applying contact pad of the other side.

In another embodiment, the PCB has at least 4 layers.

In another embodiment, a length of a signal path from the contact junction of the other side of the PCB to the same signal applying contact pad of the other side of the PCB is equal to a sum of a length of a signal path from the contact junction of the other side of the PCB to the via of the other side of the PCB, a length of the via from the other side of the PCB to the one side of the PCB, and a length of a signal path from the via of the one side of the PCB to the same signal applying contact pad of the one side of the PCB.

In another embodiment, signal lines transmitting high-frequency signals are arranged proximal to the via.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 1:
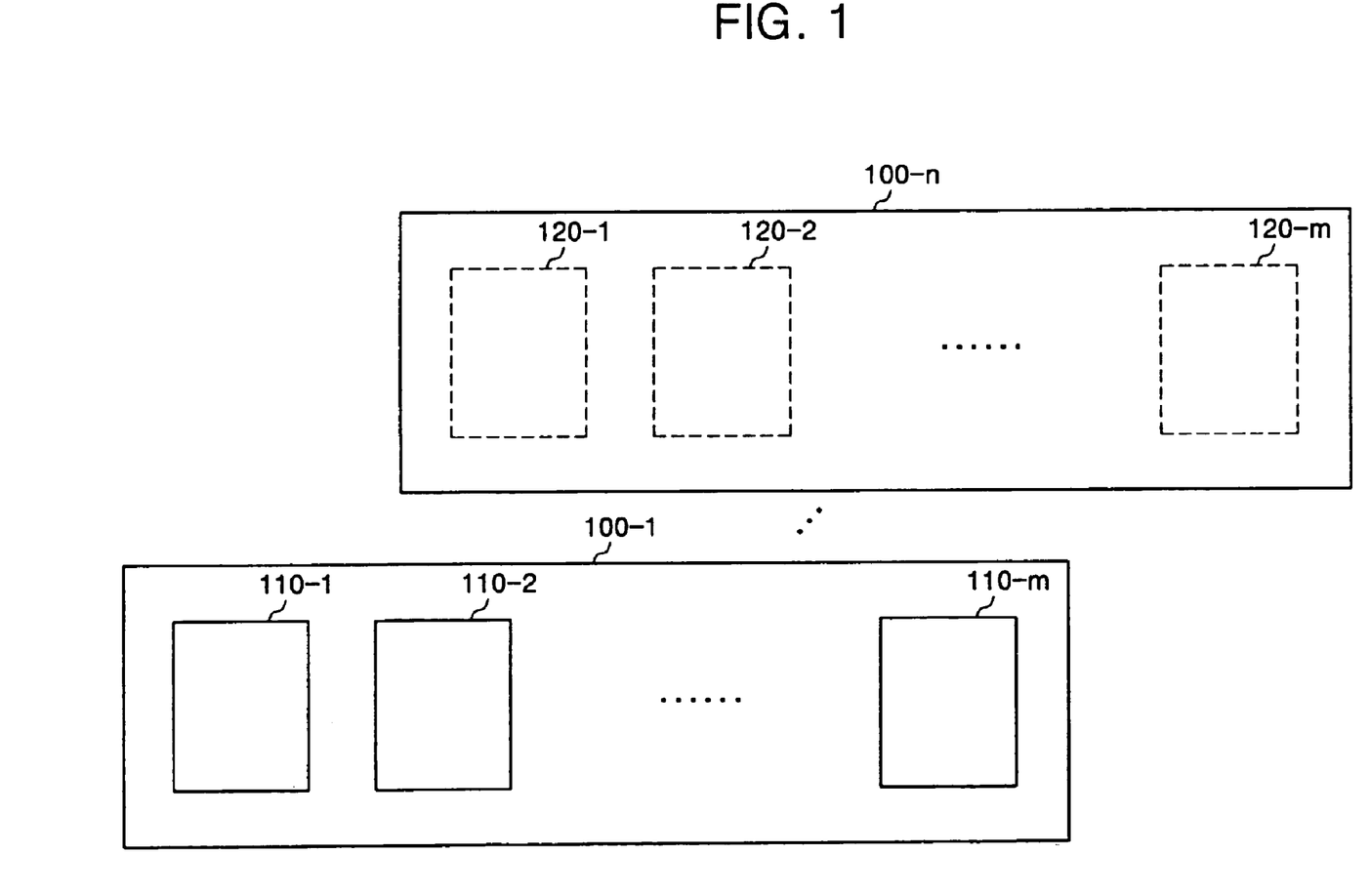
FIG. 1 is a schematic view of a PCB illustrating a conventional memory module.

FIG. 1 is a schematic view illustrating a conventional memory module. A PCB of the memory module of FIG. 1 includes n layers 100-1 to 100-n. m memory chips 110-1 to 110-n are mounted on one side of the PCB, and m memory chips 120-1 to 120-m are mounted on the other side of the PCB in a mirror form, facing the m memory chips 110-1 to 110-m. Here, one side of the PCB is referred to as one side of the first layer 100-1, and the other side of the PCB is referred to as the other side of the n-th layer 100-n.

The PCB includes n layers, for example, 4 or 6 layers. Assuming the PCB includes 4 layers, as two layers not shown in the drawing, one layer serves as a layer to which a power voltage is applied, and the other layer serves as a layer to which a ground voltage is applied. If the PCB includes 6 layers, as four layers not shown in the drawing, two layers serve as a layer to which a power voltage is applied and a layer which a ground voltage is applied, respectively, and two layers serve as a layer to which an address signal is applied and a layer to which a clock signal is applied, respectively.

Figure 2A:
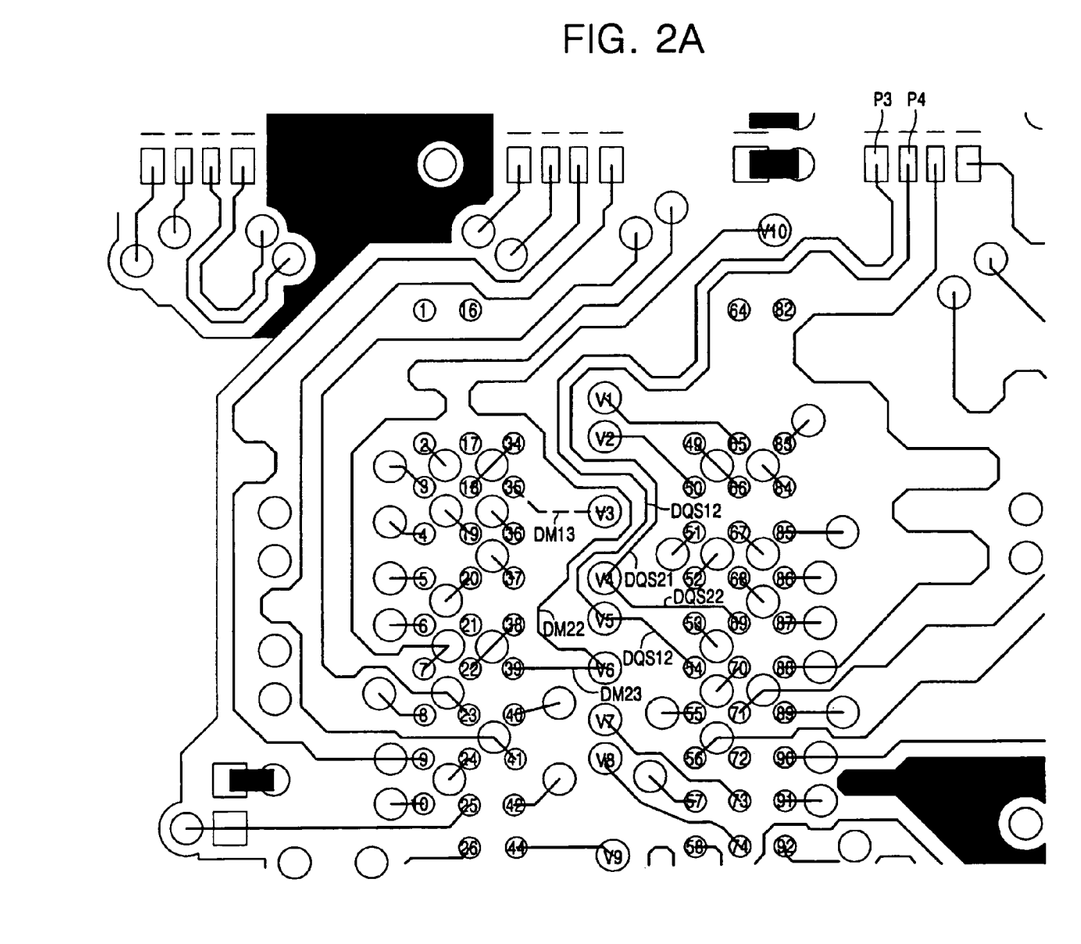
FIGS. 2a and 2b are plan views illustrating a pad, via, and signal line arrangement of both sides of a portion of a PCB on which memory chips are mounted in a mirror configuration according a conventional embodiment.
Figure 2B:
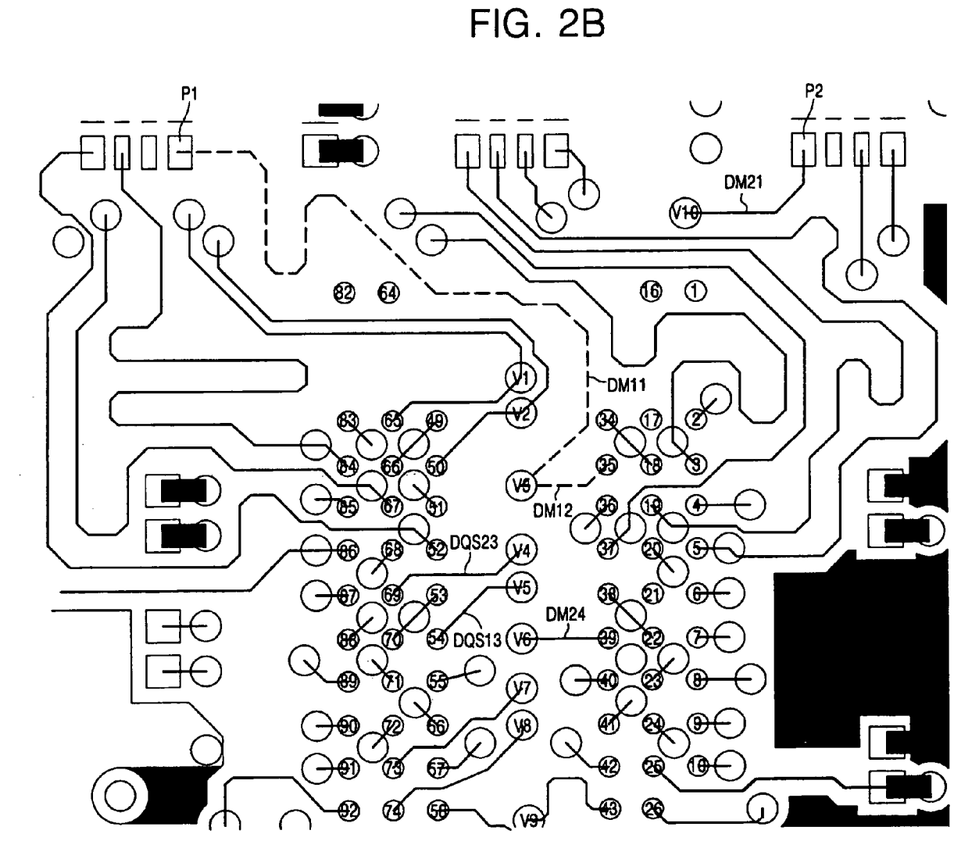

FIGS. 2a and 2b are plan views illustrating a pad, via, and signal line arrangement of both sides of a portion of a PCB on which memory chips are mounted in a mirror configuration according a conventional embodiment. FIG. 2a illustrates an arrangement of one side of the PCB, and FIG. 2b illustrates an arrangement of the other side of the PCB. That is, FIG. 2a illustrates an arrangement of one side of the first layer 100-1 of the PCB of FIG. 1, and FIG. 2b shows arrangement of the other side of the n-th layer 100-n of the PCB of FIG. 1.

In FIGS. 2a and 2b, small circles indicated by 1 to 92 denote contact pads to which balls of a memory chip are applied, and large circles denote vias. Circles indicated by VI to V9 denote vias arranged on a center line of the memory chip, and dotted lines denotes a first data masking signal line.

In FIGS. 2a and 2b, the contact pads 1 to 92 may be pads for transmitting a power voltage, a ground voltage, data, an address, first and second data masking signals, a command signal, and first and second data strobe signals, and the contact pads indicated by the same number should receive the same signal.

In FIGS. 2a and 2b, P1 and P2 respectively denote first and second data masking signal applying terminals, P3 and P4 respectively denote first and second data strobe signal applying terminals, 35 and 39 respectively denote first and second data masking signal applying balls, and 54 and 56 respectively denote first and second data strobe signal applying balls. A method for arranging signal lines from the pads in contact with the same signal applying balls of memory chips on opposite sides of the PCB is explained below.

In FIGS. 2a and 2b, the pads 35 and 39 in contact with the first and second data masking signal applying balls and the pads 54 and 69 in contact with the first and second data strobe signal applying balls, which are arranged on one side of the PCB, are arranged in the mirror form with the pads 35 and 39 in contact with the first and second data masking signal applying balls and the pads 54 and 69 in contact with the first and second data strobe signal applying balls, which are arranged on the other side of the PCB.

Vias V3 to V6 are formed at a central location between the pads 35 and 39 in contact with the first and second data masking signal applying balls arranged in the mirror form and the pads 54 and 69 in contact with the first and second data strobe signal applying balls.

A method for connecting a signal line from the first data masking signal applying terminal P1 of the other side of the PCB to the pads 35 in contact with the first data masking signal applying balls arranged on both sides of the PCB in the mirror form includes arranging a first data masking signal line DM11 from the first data masking signal applying line P1 of the other side of the PCB to the via V3 of the other side, arranging a first data masking signal line DM12 from the via V3 of the other side of the PCB to the pad 35 in contact with the first data masking signal applying ball, connecting the via V3 of the other side of the PCB to the via V3 of the one side of the PCB, and arranging a first data masking signal line DM13 from the via V3 of the one side of the PCB to the pad 35 in contact with the first data masking signal applying ball of the one side of the PCB.

Then, a method for connecting a signal line from the second data masking signal applying terminal P2 of the other side of the PCB to the pad 39 in contact with the second data masking signal applying balls arranged on both sides of the PCB in the mirror form includes forming the via V10, arranging a second data masking signal line DM21 from the second data masking signal applying terminal P2 of the other side of the PCB to the via V10 of the other side of the PCB, connecting the via V10 of the other side of the PCB to the via V10 of the one side of the PCB, arranging a second data masking signal line DM22 from the via V10 of the one side of the PCB to the via V6 of the one side of the PCB, arranging a second data masking signal line DM23 from the via V6 of the one side of the PCB to the pad 39 in contact with the second data masking signal applying ball of the one side of the PCB, connecting the via V6 of the one side of the PCB to the via V6 of the other side of the PCB, and arranging a second data masking signal line DM24 from the via V6 of the other side of the PCB to the pad 39 in contact with the second masking signal applying ball of the other side of the PCB.

A method for connecting a signal line from the first data strobe signal applying terminal P3 of the other side of the PCB to the pads 54 in contact with the first data strobe signal applying balls arranged on both sides of the PCB in the mirror form includes arranging a first data strobe signal line DQS11 from the first data strobe signal applying line P3 of the one side of the PCB to the via V5 of the one side of the PCB, arranging a first data strobe signal line DQS12 from the via V5 of the one side of the PCB to the pad 54 in contact with the first data strobe signal applying ball, connecting the via V5 of the one side of the PCB to the via V5 of the other side of the PCB, and arranging a first data strobe signal line DQS13 from the via V5 of the other side of the PCB to the pad 54 in contact with the first data strobe signal applying ball of the other side of the PCB.

Similarly, a method for connecting a signal line from the second data strobe signal applying terminal P4 of the other side of the PCB to the pads 69 in contact with the second data strobe signal applying balls arranged on both sides of the PCB in the mirror form includes arranging a second data strobe signal line DQS21 from the second data strobe signal applying line P4 of the one side of the PCB to the via V4 of the one side of the PCB, arranging a second data strobe signal line DQS22 from the via V4 of the one side of the PCB to the pad 69 in contact with the second data strobe signal applying ball of the one side of the PCB, connecting the via V4 of the one side of the PCB to the via V4 of the other side of the PCB, and arranging a second data strobe signal line DQS23 from the via V4 of the other side of the PCB to the pad 69 in contact with the second data strobe signal applying ball of the other side.

The conventional signal line arrangement method of the memory module described above forms vias at a central location between the pads in contact with the same signal applying balls arranged in the mirror form and arranges the same signal lines from the vias to the pad in contact with the same signal line of one side of the PCB and to the pad in contact with the same signal line of the other side of the PCB. Thus, the signal lines are the same in length for those lines from the vias formed at the central location to the same signal applying balls arranged on both sides of the PCB in the mirror form, whereby signals applied from the chips arranged on both sides can be applied at the same time point. However, the conventional signal line arrangement method has a spatial restriction in the configuration of signal lines arranged around the vias, i.e., the first and second data strobe signal applying lines.

Figure 3A:
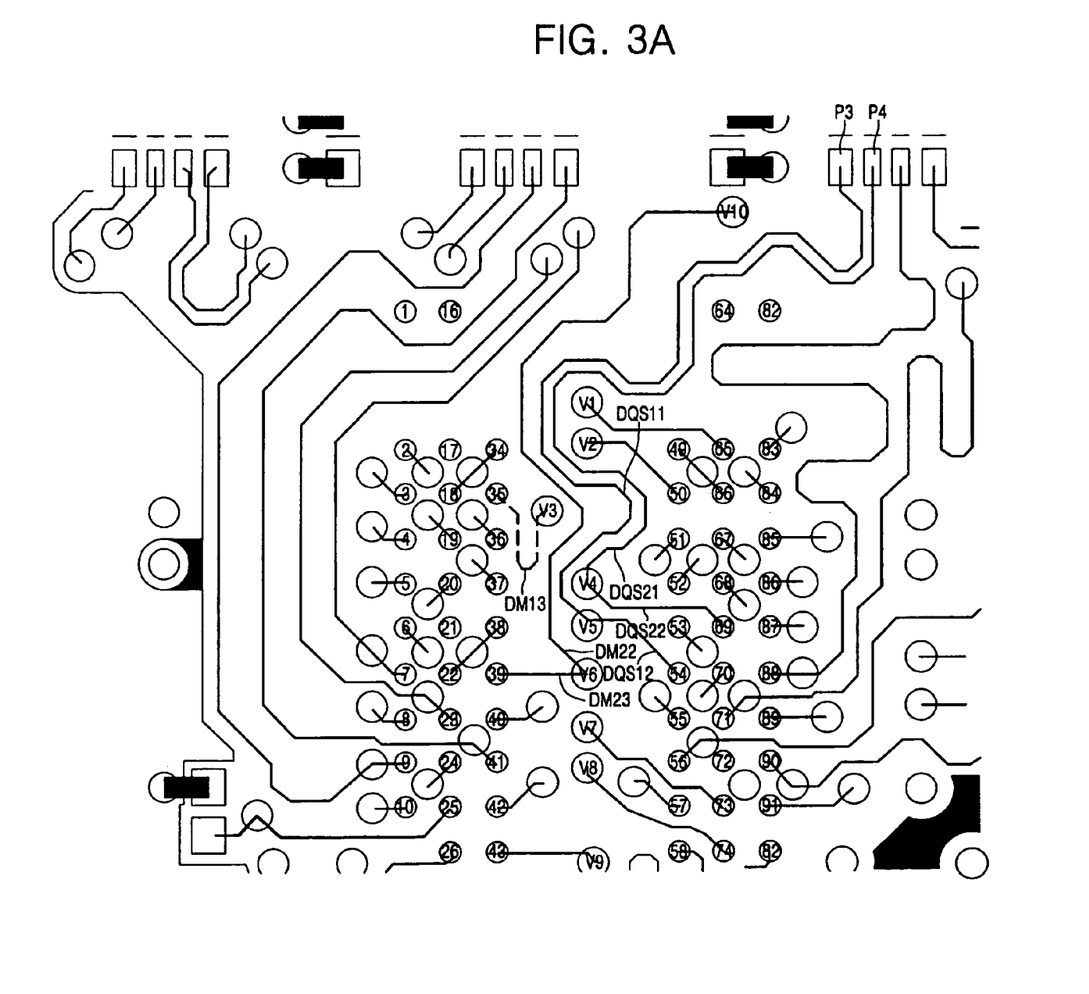
FIGS. 3a and 3b are plan views illustrating a pad, via, and signal line arrangement of both sides of a portion of a PCB on which memory chips are mounted according to another conventional embodiment.
Figure 3B:
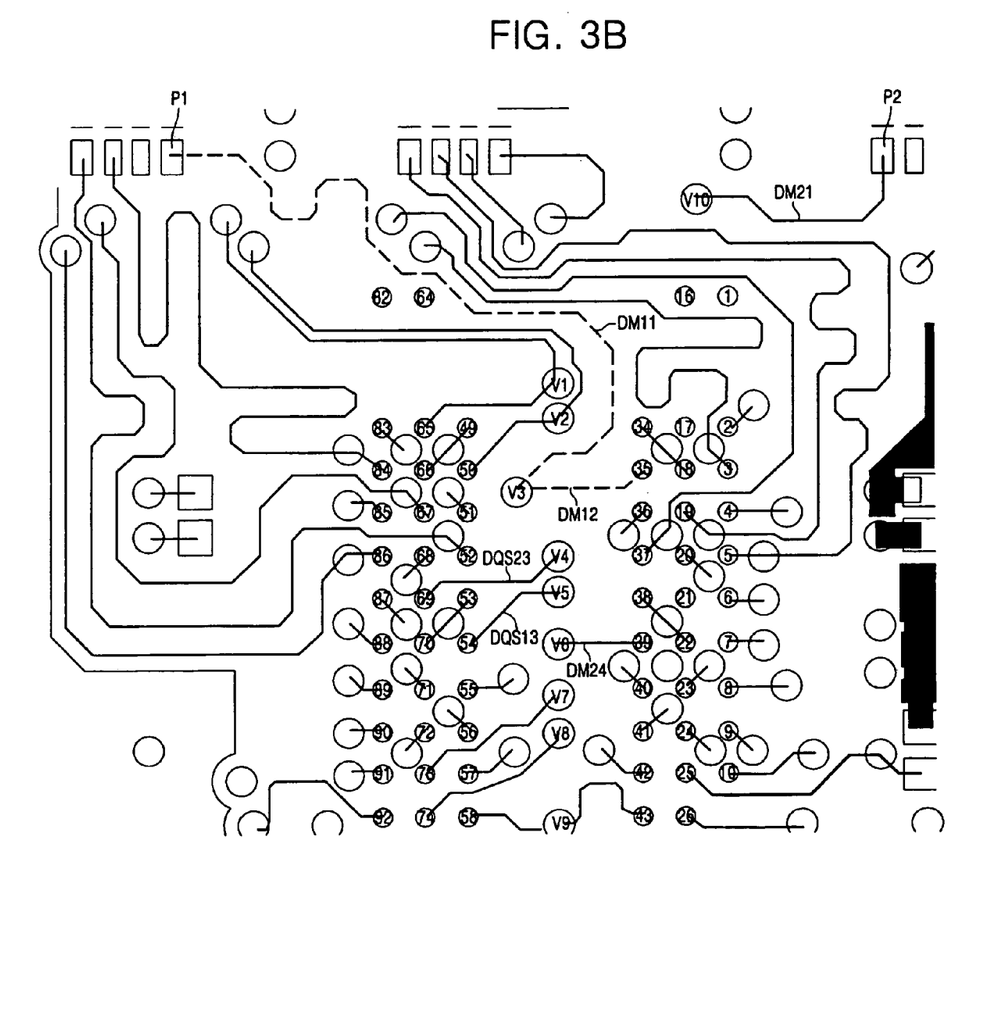

FIGS. 3*a* and 3*b* are plan views illustrating a pad, via, and signal line arrangement of both sides of a portion of a PCB on which memory chips are mounted according to another conventional embodiment. FIG. 3*a* shows arrangement of one side of the PCB, and FIG. 3*b* shows arrangement of the other side of the PCB. That is, FIG. 3*a* shows arrangement of one side of the first layer 100-1 of the PCB of FIG. 1, and FIG. 3*b* shows arrangement of the other side of the n-th layer **100-*n* of the PCB of FIG. 1**.

Like reference and reference numerals of FIGS. 2*a* and 2*b* and FIGS. 3*a* and 3*b* denote like parts, and thus description of FIGS. 2 and 2*b* of those similar parts can be applied to FIGS. 3*a* and 3*b*.

Arrangement of the via V3 and the first data masking signal lines DM11 to DM13 according to arrangement of the via V3 are different from those of FIGS. 2*a* and 2*b*, but arrangement of the second data masking signal lines DM21 to DM24 and arrangement of first and second data strobe signal lines DQS11 to DQS13 and DQS21 to DQS23 are the same as those of FIGS. 2*a* and 2*b*.

Thus, a method of arranging the first data masking signal lines is explained below.

The via V3 is formed at a location relatively close to the pad 35 whose one side the first data masking signal applying balls arranged in the mirror form contact.

The first data masking signal line DM11 is arranged from the first data masking signal applying terminal P1 of the other side of the PCB to the via V3 of the other side of the PCB, and the first data masking signal line DM12 is arranged from the via V3 of the other side of the PCB to the pad 35 in contact with the first data masking signal applying ball of the other side. The via V3 of the other side of the PCB is connected to the via V3 of the one side of the PCB. The first data masking signal line DM13 is arranged from the via V3 of the one side of the PCB to the pad 35 in contact with the first data masking signal applying ball of one side. Here, the first data masking signal line DM13 of the one side of the PCB is arranged in a bent form in an empty space of the PCB to have the same length as the first data masking signal line DM12 of the other side of the PCB.

That is, the signal line arrangement method of the memory module of FIGS. 3*a* and 3*b* arranges the via V3 at a location relatively close to the pad 35 in contact with the first data masking signal applying ball contacts of the one side of the PCB to reduce a spatial restriction of the first and second data strobe signal lines arranged around the via V3. In order to accomplish this, the method of FIGS. 3*a* and 3*b* requires a space for arranging the first data masking signal line DM13 in a bent form in order to make equal a length of the first data masking signal line DM13 arranged on one side of the PCB from the via V3 and a length of the first data masking signal line DM12 arranged on the other side of the PCB from the via V3. Also, the method described in FIGS. 3*a* and 3*b* has a problem in that a signal transmission time is delayed because a length of the signal line of from the via V3 to the pads 35 in contact with the first and second data masking signal applying balls is increased, as compared to the method of FIGS. 2a and 2b.

Figure 4A:
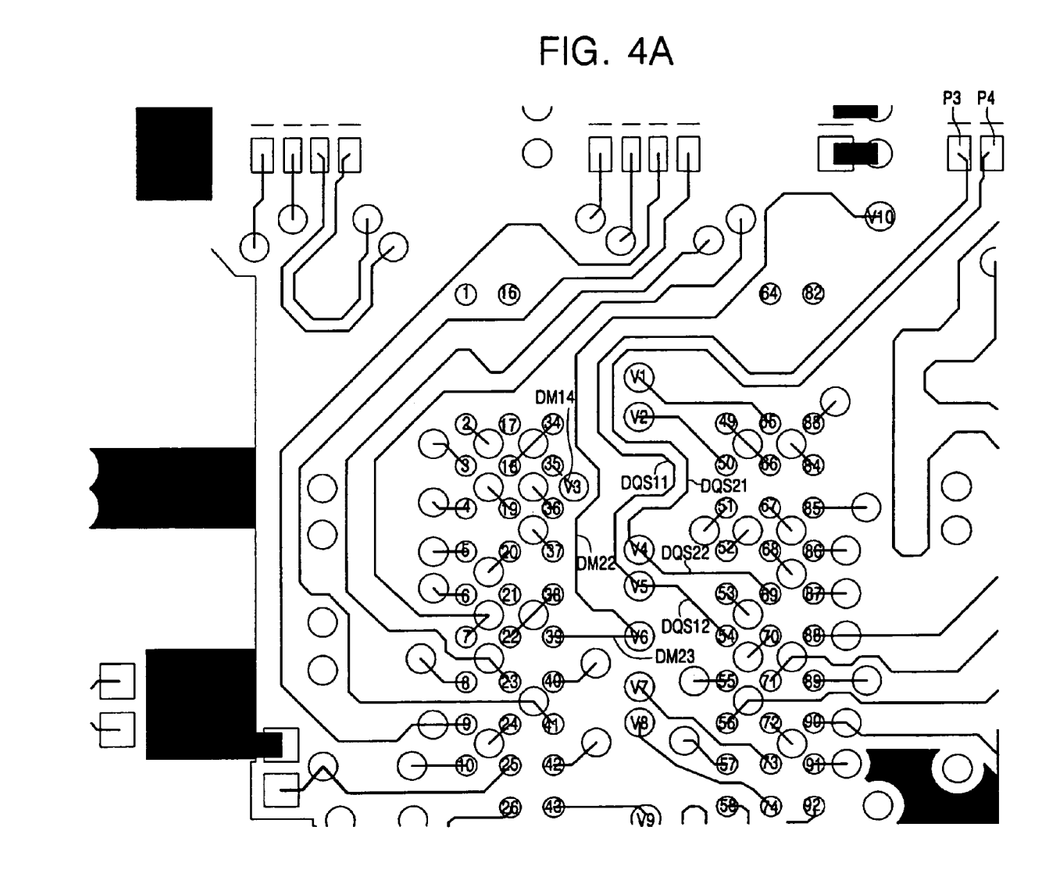
FIGS. 4a and 4b are plan views illustrating a pad, via, and signal line arrangement of both sides of a portion of a PCB on which memory chips are mounted according to the present invention.
Figure 4B:
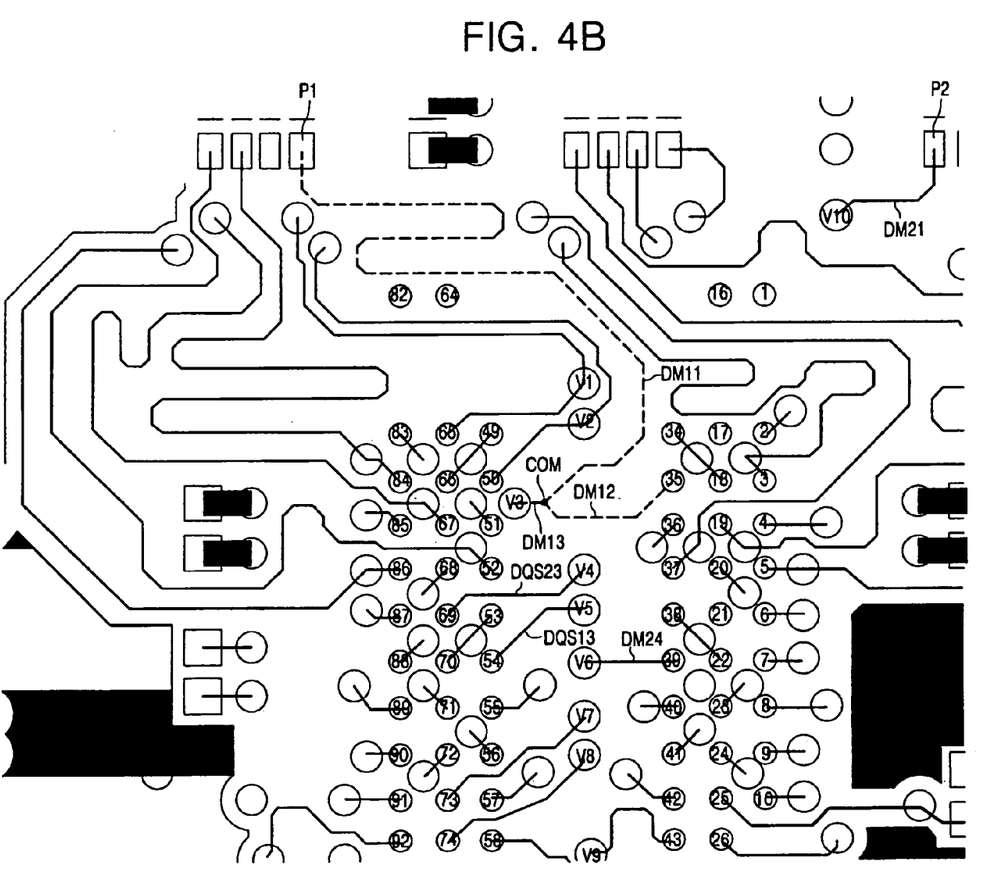

FIGS. 4a and 4b are plan views illustrating a pad, via, and signal line arrangement of both sides of a portion of a PCB on which memory chips are mounted according to the present invention. FIG. 4a shows arrangement of one side of the PCB, and FIG. 4b shows arrangement of the other side of the PCB. That is, FIG. 4a shows arrangement of one side of the first layer 100-1 of the PCB of FIG. 1, and FIG. 4b shows arrangement of the other side of the n-th layer 100-n of the PCB of FIG. 1.

Like reference and reference numerals of FIGS. 2a and 2b and FIGS. 4a and 4b denote like parts, and thus description of FIGS. 2 and 2b of those like parts can be applied to FIGS. 4a and 4b.

Arrangement of the via 3 and the first data masking signal line to DM13 according to arrangement of the via V3 are different, but arrangement of the second data masking signal lines DM21 to DM24 and arrangement of the first and second data strobe signal lines DQS11 to DQS13 and DQS21 to DQS23 are same as those of FIGS. 2a and 2b.

Thus, a method of arranging the first data masking signal lines according to the present invention is explained below.

The via V3 is formed at a location close to the pad 35 whose one side the first data masking signal applying balls arranged in the mirror form contact.

The first data masking signal line portion DM11 is arranged from the first data masking signal applying terminal P1 of the other side to a contact junction COM, and the first data masking signal line portion DM12 is arranged from the contact junction COM to the pad 35 which the first data masking signal applying ball of the other side contacts. The first data masking signal line portion DM13 is arranged from the contact junction COM to the via V3 of the other side of the PCB, and the via V3 of the other side of the PCB is connected to the via V3 of the one side of the PCB. The first data masking signal line portion DM14 is arranged from the via V3 of the one side of the PCB to the pad 35 in contact with the first data masking signal applying ball of the one side of the PCB. Here, the contact junction COM is arranged at a location which makes equal a signal transmission time of a signal from the contact junction COM to the pad 35 in contact with the first data masking signal applying ball of the other side of the PCB and a signal transmission time of a signal from the contact junction COM to the pad 35 in contact with the first data masking signal applying ball of the one side of the PCB. For example, the contact junction COM is preferably arranged at a location such that a sum of a length of the first data masking signal line portion DM13, a length of the via V3 from the one side of the PCB to the other side of the PCB and a length of the first data masking signal line DM14 is equal to a length of the first data masking signal line DM12.

That is, the signal line arrangement of the memory module of FIGS. 4a and 4b according to the present invention arranges the via V3 at a location close to the pad 35 in contact with the first data masking signal applying ball arranged on the other side, thereby making it easy to arrange the first and second data masking signal lines. The first data masking signal line is not branched off from the via V3 as in the embodiment of FIG. 3 described above, but instead the first data masking signal line is branched off from the contact junction COM between the via V3 and the pad 35 in contact with the first data masking signal applying ball arranged on the one side of the PCB, so that a length of the first data masking signal line DM12 is not increased, as compared to the approach taken in FIGS. 3a and 3b above, and the first data masking signal line DM12 has the same length as a sum of lengths of the first data masking signal lines DM13 and DM14 and the length of the via V3, between the one side of the PCB and the other side of the PCB. As a result, the first data masking signals applied to the memory chips mounted on both sides of the PCB are simultaneously transmitted to the memory chips. Also, the first data masking signal lines DM13 and DM14 are arranged from the contact junction COM to the pad 35 which the first data masking signal applying ball arranged on the other side contacts, whereby there is no need to arrange the first data masking signal line DM14 in a bent form.

That is, in the signal line arrangement of the memory module according to the present invention, a length of the via V3 between the one side and the other side of the PCB is part of the overall length of the first data masking signal line from the via V3 of the other side to the pad which the first data masking signal applying ball of one side contacts. Thus, if the PCB has 6 layers, lengths of the first data masking signal lines DM13 and DM14 are shorter than for a PCB having 4 layers.

As described above, the signal line arrangement of the memory module according to the present invention has no spatial restriction to arranging the via between the same signal applying balls arranged in the mirror form and can reduce the signal transmission time because the signal line for transmitting the same signal is not branched at the via location.

The signal line arrangement of the memory module according to the embodiment of the present invention has been described focusing on arrangement of the data masking signal lines and the data strobe signal lines, but the present invention can be equally applied to the arrangement of other signal lines.

In the signal line arrangement of the memory module according to the embodiment of the present invention, both sides of the PCB have been described as referred to as the first layer and the n-th layer but can be other layers arranged between the first layer and the n-th layer.

As described herein before, the signal line arrangement of the memory module according to the embodiment of the present invention has an advantage in that it eases the arrangement of signal lines around the via since there is no spatial restriction to arranging the via for transmitting a signal to be applied to the pads in contact with the same signal applying balls arranged in the mirror form.

Further, it is possible to optimize the signal transmission time and signal characteristics since the signal lines for transmitting the same signal are branched not through the via but rather through the discrete contact junction so that the signal transmission times that the signals are transmitted to the same signal applying contact pads of both sides of the PCB can be equal.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A memory module, comprising:
    memory chips mounted on both sides of the module in a mirrored configuration;
    a printed circuit board (PCB) having same signal applying contact pads arranged on both sides in contact with same signal applying balls of the memory chips in the mirrored configuration, the PCB including a via at a location proximal to the same signal applying contact pad of one side of the PCB among the same signal applying contact pads arranged on both sides in the mirrored configuration, the via connecting an other side of the PCB to the one side of the PCB, and a contact junction connected to the same signal applying contact pad of the other side of the PCB, the contact junction being connected to the via of the other side of the PCB, and the via of the one side of the PCB being connected to the same signal applying contact pad of the one side of the PCB, the contact junction connected to a signal terminal from the other side of the PCB; and wherein the contact junction is positioned at a location such that a signal transmission time from the contact junction to the same signal applying contact pad of the one side of the PCB is equal to a signal transmission time from the contact junction to the same signal applying contact pad of the other side of the PCB.

2. The module of claim 1, wherein the contact junction is positioned between the via and the same signal applying contact pad of the other side.

3. The module of claim 1, wherein the PCB has at least 4 layers.

4. The module of claim 1, wherein a length of from the contact junction of the other side to the same signal applying contact pad of the other side is equal to a sum of a length of from the contact junction of the other side to the via of the other side, a length of the via of the other side to the via of one side, and a length of the via of one side to the same signal applying contact pad of one side.

5. The module of claim 1, wherein signal lines transmitting signals which are transmitted at a high frequency are arranged around the via.

6. A signal line arrangement method of a memory module including memory chips mounted on both sides of the module in a mirrored configuration and a printed circuit board (PCB) having same signal applying contact pads arranged on both sides in contact with same signal applying balls of the memory chips in the mirrored configuration, the method comprising:

forming a via at a location proximal to the same signal applying contact pad of one side of the PCB among the same signal applying contact pads arranged on both sides in the mirrored configuration, the via connecting an other side of the PCB to the one side of the PCB, connecting a signal terminal from the other side of the PCB to a contact junction, connecting the contact junction to the same signal applying contact pad of the other side of the PCB, connecting the contact junction to the via of the other side of the PCB, and connecting the via of the one side of the PCB to the same signal applying contact pad of the one side of the PCB, and further comprising positioning the contact junction at a location such that a signal transmission time from the contact junction to the same signal applying contact pad of the one side of the PCB is equal to a signal transmission time from the contact junction to the same signal applying contact pad of the other side of the PCB.

7. The method of claim 6, further comprising positioning the contact junction between the via and the same signal applying contact pad of the other side.

8. The method of claim 6, wherein the PCB has at least 4 layers.

9. The method of claim 6, wherein a length of from the contact junction of the other side to the same signal applying contact pad of the other side is equal to a sum of a length of from the contact junction of the other side to the via of the other side, a length of the via of the other side to the via of one side, and a length of the via of one side to the same signal applying contact pad of one side.

10. The method of claim 6, wherein signal lines which operate at a high frequency are arranged around the via.

* * * * *

UNITED STATES PATENT AND TRADEMARK OFFICE
CERTIFICATE OF CORRECTION

PATENT NO. : 7,390,973 B2
APPLICATION NO. : 11/357500
DATED : June 24, 2008
INVENTOR(S) : Chil-Nam Yoon et al.

It is certified that error appears in the above-identified patent and that said Letters Patent is hereby corrected as shown below:

Delete all of claim 4 at column 9 lines 23-29 and insert -- The module of claim 1, wherein a length of a signal path from the contact junction of the other side of the PCB to the same signal applying contact pad of the other side of the PCB is equal to a sum of a length of a signal path from the contact junction of the other side of the PCB to the via of the other side of the PCB, a length of the via from the other side of the PCB to the one side of the PCB, and a length of a signal path from the via of the one side of the PCB to the same signal applying contact pad of the one side of the PCB --

Delete all of claim 9 at column 10, lines 27-33 and insert -- The method of claim 6, wherein a length of a signal path from the contact junction of the other side of the PCB to the same signal applying contact pad of the other side of the PCB is equal to a sum of a length of a signal path from the contact junction of the other side of the PCB to the via of the other side of the PCB, a length of the via from the other side of the PCB to the one side of the PCB, and a length of a signal path from the via of the one side of the PCB to the same signal applying contact pad of the one side of the PCB --

Claim 5, column 9, line 31 delete "signals which are transmitted at a high frequency" and insert -- high-frequency signals --

Claim 5, column 9, line 32 delete "around" and insert -- proximal to --

Claim 10, column 10, line 34 delete "which"

Claim 10, column 10, line 35 delete "operate at high frequency" and insert -- transmitting high-frequency signals --

UNITED STATES PATENT AND TRADEMARK OFFICE
CERTIFICATE OF CORRECTION

PATENT NO.          : 7,390,973 B2
APPLICATION NO.  : 11/357500
DATED                   : June 24, 2008
INVENTOR(S)         : Chil-Nam Yoon et al.

It is certified that error appears in the above-identified patent and that said Letters Patent is hereby corrected as shown below:

Claim 10, column 10, line 35 delete "around" and insert -- proximal to --

Signed and Sealed this

Ninth Day of December, 2008

JON W. DUDAS
*Director of the United States Patent and Trademark Office*